(12) United States Patent
Hoenigschmid et al.

(10) Patent No.: US 7,599,209 B2
(45) Date of Patent: Oct. 6, 2009

(54) MEMORY CIRCUIT INCLUDING A RESISTIVE MEMORY ELEMENT AND METHOD FOR OPERATING SUCH A MEMORY CIRCUIT

(75) Inventors: Heinz Hoenigschmid, Poecking (DE); Milena Dimitrova, Munich (DE); Corvin Liaw, Munich (DE); Michael Angerbauer, Palling (DE)

(73) Assignee: Infineon Technologies AG, Munich (DE)

( * ) Notice: Subject to any disclaimer, the term of this patent is extended or adjusted under 35 U.S.C. 154(b) by 37 days.

(21) Appl. No.: 11/318,345

(22) Filed: Dec. 23, 2005

(65) Prior Publication Data

US 2007/0171698 A1    Jul. 26, 2007

(51) Int. Cl.
*G11C 11/00* (2006.01)
(52) U.S. Cl. .................. 365/148; 365/158; 365/163; 365/171; 365/173
(58) Field of Classification Search .............. 365/163, 365/148, 158, 171, 173
See application file for complete search history.

(56) References Cited

U.S. PATENT DOCUMENTS

| | | | | |
|---|---|---|---|---|
| 5,986,474 | A | 11/1999 | Chung et al. | |
| 6,038,169 | A * | 3/2000 | Ogura et al. | 365/185.11 |
| 6,940,777 | B2 * | 9/2005 | Ooishi | 365/226 |
| 7,042,759 | B2 * | 5/2006 | Nemati et al. | 365/159 |
| 7,149,103 | B2 * | 12/2006 | Ahn | 365/148 |
| 2002/0089024 | A1 * | 7/2002 | Iwata | 257/421 |
| 2003/0198078 | A1 * | 10/2003 | Baker | 365/148 |
| 2004/0001353 | A1 * | 1/2004 | Hidaka | 365/171 |
| 2004/0160798 | A1 | 8/2004 | Rinerson et al. | |
| 2005/0078537 | A1 * | 4/2005 | So et al. | 365/211 |
| 2005/0180188 | A1 * | 8/2005 | Bedeschi et al. | 365/145 |
| 2005/1025890 | * | 11/2005 | Maruyama et al. | 331/16 |
| 2006/0050547 | A1 * | 3/2006 | Liaw et al. | 365/148 |
| 2007/0041251 | A1 * | 2/2007 | Roehr | 365/189.09 |
| 2007/0058424 | A1 * | 3/2007 | Inaba et al. | 365/158 |
| 2009/0086534 | A1 * | 4/2009 | DeBrosse et al. | 365/163 |

* cited by examiner

*Primary Examiner*—Vu A Le
*Assistant Examiner*—Han Yang
(74) *Attorney, Agent, or Firm*—Dicke, Billig & Czaja, PLLC

(57) ABSTRACT

The present invention relates to a memory circuit and method of operating the same. In at least one embodiment, the memory circuit includes a resistive memory element coupled to a plate potential by a first terminal; a bit line which is connectable to a second terminal of the resistive memory element; a programming circuit operable to change the resistance of the resistive memory element; a bleeder circuit operable to provide a bleeding current to or from the bit line due to a change of the resistance of the resistive memory element caused by the programming circuit.

17 Claims, 8 Drawing Sheets

PRIOR ART

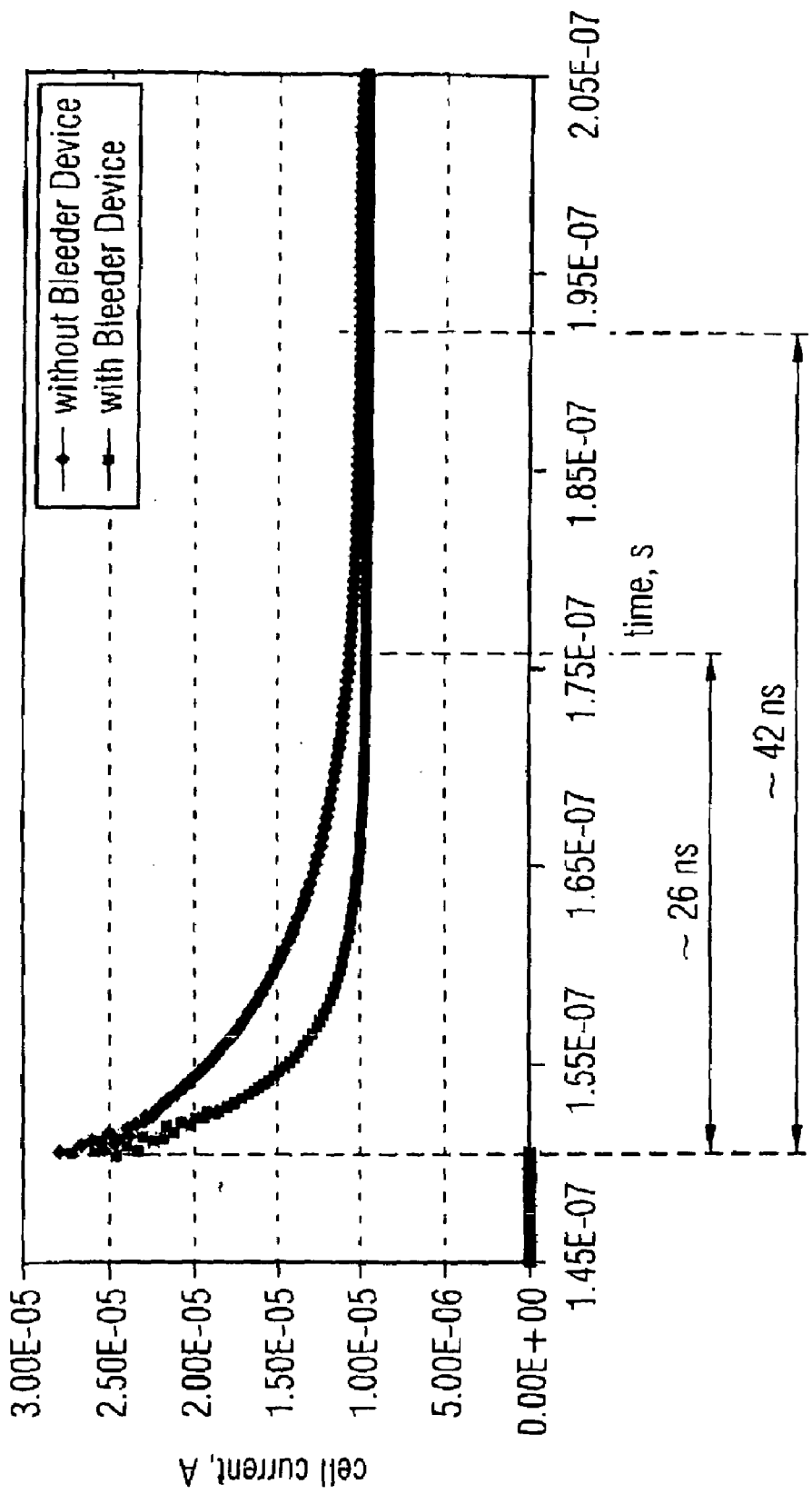

MEMORY CIRCUIT INCLUDING A RESISTIVE MEMORY ELEMENT AND METHOD FOR OPERATING SUCH A MEMORY CIRCUIT

BACKGROUND OF THE INVENTION

1. Field of the Invention

The present invention relates to a memory circuit including a resistive memory element such as a CBRAM memory element, also called a PMC element (PMC: programmable metallization cell). The present invention further relates to a method for operating such a memory circuit.

2. Description of the Related Art

A CBRAM memory element, which in the following shall be called resistive memory element, comprises a dielectric material in which a conductive path can be established and degenerated. By applying electrical field, ions from a conductive material of an electrode move into the dielectric material and form the conductive path. By applying a reversed electrical field, the ions of the conductive material are removed from the dielectric material back towards the electrode in such a way that the resistive memory element is rendered non-conductive. In other words, the resistive memory element can have different resistance states such as a low resistance state and a high resistance state.

While programming the resistive memory element from the high resistance state to the low resistance state, the changing of the resistance takes place quite rapidly such that while applying a predetermined voltage on the resistive memory element the current through the resistive memory element increases quickly as the resistance drops. Therefore, while programming the resistive memory element a limitation of the current is necessary so that the resistive memory element is not damaged while in the low resistance state. In order to deal with this physical behavior, a settable reference current source is used for limiting the current through the resistive memory element to a compliance current while programming the resistive memory element. As the changing of the resistance of the resistive memory element during the programming from the high resistance state to the low resistance state is quite short, the current through the resistive memory element results in a charging the parasitic capacity of the bit line to which the resistive memory element is coupled. Due to the capacity of the bit line, the current peak through the resistive memory element during the charging of the bit line capacity is determined by the resistance of the low resistance state of the resistive memory element, the resistance of the bit line and the resistance of a selection transistor by which the resistive memory element is coupled to the bit line. The reference current supplied by the reference current source has therefore no influence on the current flowing through the resistive memory element during the rapid changing of its resistance. The current flowing through the resistive memory element during the rapid changing of its resistance may be damaging to the resistive memory element, particularly when applied for a time period of more than 40 ns.

SUMMARY OF THE INVENTION

It is therefore an object of the present invention to provide a memory circuit and a method for operating such a memory circuit wherein a time period during which the unlimited current can flow through the resistive memory element is reduced or eliminated.

According to a first aspect of the present invention, a memory circuit is provided which comprises a resistive memory element coupled by a first terminal to a plate potential wherein the resistive memory element may be operable to be transferred to a low resistance state by applying a programming voltage and to be transferred to a high resistance state by applying an erasing voltage, a bit line which is connectable to a second terminal of the resistive memory element, a programming circuit operable to apply a programming signal, in particular a programming voltage and a programming current on the resistive memory element to change the resistance state of the resistive memory element, in particular to transfer the resistive memory element into the low resistance state, and a bleeder circuit operable to provide a bleeding current to or from the bit line to support a potential change of the bit line potential due to a change of the resistance of the resistive memory element caused by the applied programming potential.

The memory circuit according to the present invention is therefore equipped with an additional current source (bleeder circuit) which supports the charging of the bit line during the rapid change of the resistance of the resistive memory element and therefore allows for the reducing of the time period during which a high current flows through the resistive memory element. As the rapid change of the resistance of the resistive memory element results in a change of the potential on the bit line to which the resistive memory element is coupled, the bit line has to be recharged which, due to its capacity, is considerable since the bit line has a significant length as it is usually coupled to a larger number of resistive memory elements in a modern memory array. The bleeder circuit is provided which is connected to the bit line and provides an additional bleeding current to support the potential change of the bit line during the rapid change of the resistance of the resistive memory element.

Preferably, the bleeder circuit is operable to supply the bleeding current during a predetermined time period.

The bleeder circuit may be designed in such a way that the time period starts when after applying the programming voltage via the bit line on the resistive memory element a gradient of the voltage between the bit line and the plate potential exceeds a threshold and/or a difference between the programming voltage and the bit line potential exceeds a threshold.

Furthermore, the bleeder circuit may be designed in such a way that the time period ends after a predetermined time. The predetermined time may be determined depending on at least one of the parameters the programming voltage applied on the resistive memory element during the programming of the resistance change gradient due to the appliance of the programming current, and the capacity of the bit line and the resistance of the bit line.

According to a preferred embodiment of the present invention, the bleeder circuit comprises a switch to selectively couple a bleeder potential to the bit line depending on a bleed signal.

Preferably, the bleeder circuit comprises a comparator which is operable to detect a voltage change between the bit line and a reference potential which depends on the programming voltage, due to the change of the resistance of the resistive memory element and to generate the bleed signal depending on the voltage change.

According to a preferred embodiment, the bleeder circuit further comprises another switch which is arranged in series to the switch and which is closed during a predetermined time period wherein the time period starts after applying the programming voltage on the bit line.

According to another embodiment of the present invention, a selection transistor is arranged to selectively couple the resistive memory element with the bit line depending on an activation signal.

According to another aspect of the present invention, a memory circuit is provided comprising a resistive memory element coupled by a first terminal to a plate potential wherein the resistive memory element is operable to be transferred to a low resistance state by applying a programming voltage and to be transferred to a high resistance state by applying an erasing voltage, a bit line which is connectable to a second terminal of the resistive memory element, a programming circuit operable to apply a programming voltage and a programming current on the resistive memory element to transfer the resistive memory element into the low resistance state, a bleeder circuit operable to provide a bleeding current to or from the bit line to support a potential change of the bit line potential due to a change of the resistance of the resistive memory element caused by the applied programming current. The bleeder circuit comprises a dummy resistive memory element which is coupled to a bleeder potential with a first terminal and which is connectable to the bit line with a second terminal.

The provision of the bleeder circuit including a dummy resistive memory element has the advantage that the bleeding current is provided if the resistance of the dummy resistive memory element changes to a low resistance state. While applying the programming current both the resistive memory element and the dummy resistive memory element are exposed to the same programming voltage as both are connected via the same bit line and the same plate potential such that the change of the resistance states of both the resistive memory elements substantially occurs in the same time period. Consequently, the current which is necessary to charge the bit line during the change of the potential of the bit line is supplied by both of the resistive memory elements. As the overall resistance of the combined resistive memory elements is lower than the resistance of a single resistive memory element, the charging of the bit line is performed faster so that the time during which a high current flows through the resistive memory element is reduced.

Preferably, the dummy resistive memory element is designed in a similar manner as the resistive memory element.

According to one embodiment of the present invention, the bleeder circuit further comprises a bleed transistor to selectively couple the dummy resistive memory element to the bit line.

According to another embodiment of the present invention, a selection transistor is arranged to selectively couple the resistive memory element with the bit line depending on an activation signal.

The bleeder circuit may comprise a control circuit which is operable to activate the bleed transistor simultaneously to the activation of the selection transistor such that the dummy resistive memory element is coupled with the bit line when the programming voltage is applied to the resistive memory element by the programming circuit.

Alternatively, the control circuit comprises an erasing circuit which is operable to erase the dummy resistive memory element to a high resistance state after the resistive memory element has been programmed.

According to another aspect of the present invention, a method for operating a memory circuit is provided which comprises a resistive memory element coupled by a first terminal to a plate potential wherein the resistive memory element may be operable to be transferred to a low resistance state by applying a programming voltage and to be transferred to a high resistance state by applying an erasing voltage, and a bit line which is connectable to a second terminal of the resistive memory element. The method comprises the steps of applying a programming signal, in particular a programming voltage and a programming current to the resistive memory element to transfer the resistive memory element into the low resistance state and providing a bleeding current to or from the bit line to support a potential change of the bit line potential due to a change of the resistance of the resistive memory element caused by the applied programming signal.

The provision of the bleeding current is advantageous to support a recharging of the bit line during the rapid change of the resistance of the resistive memory element. Thereby, the duration of a high current through the resistive memory element can be reduced and the resistive memory element is subjected to reduced stress.

According to a preferred embodiment, the bleeding current is supplied during a predetermined time period. Furthermore, the start of the time period may be determined when after applying the programming voltage on the resistive memory element a gradient of the voltage between the bit line and the plate potential exceeds a threshold. Furthermore, it may be provided that the time period ends after a predetermined time after its start.

The predetermined time may be determined depending on at least one of the parameters the programming current applies on the resistive memory element during the programming, the resistance change gradient due to the appliance of the programming current, the capacity of the bit line and the resistance of the bit line.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 9 shows a cell current time characteristic showing the cell currents of a conventional memory circuit and a memory circuit according to the present invention.

DETAILED DESCRIPTION OF THE PREFERRED EMBODIMENT

Figure 1:
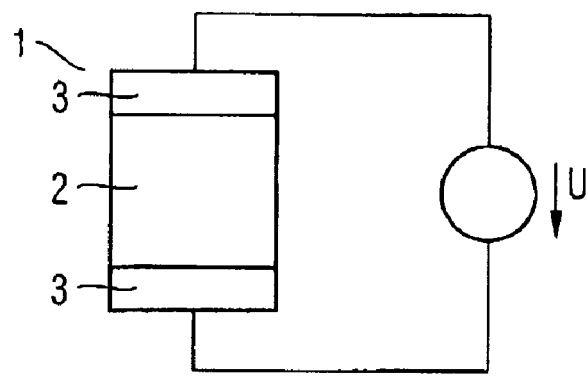
FIG. 1 shows a schematic cross-sectional view of a resistive memory element used in the present invention.

FIG. 1 depicts a cross-sectional schematic view of a resistive memory element 1 as preferably used in the present invention. The resistive memory element 1 comprises a dielectric solid state electrolyte region 2 which is arranged between two electrodes 3 wherein one electrode comprises a conductive material such as Ag, the ions of which can intrude into the material of the dielectric region 2 if a respective electrical field is applied. Conductive ions located within the dielectric region 2 may form a conductive path between the electrodes 3 so that the resistance of the resistive memory element is low. By applying a reverse electrical field on the electrodes of the resistive memory element 1, the conductive path is degenerated by forcing the conductive ions back to the respective electrode 3. Thereby, the conductive path is dissolved such that the resistance of the resistive memory element increases. Resistive memory elements on the basis of a chalcogenide material are also called CBRAM memory elements (CBRAM: Conductive Bridging RAM), PMC memory elements (PMC: Programmable Metallization Cell) and other terms can be used as well. It is intended that the present invention refers to memory circuits using resistive memory elements which can be programmed by applying an electrical signal, in particular a programming voltage or current and which change its resistance while the electrical signal is applied.

Figure 2:
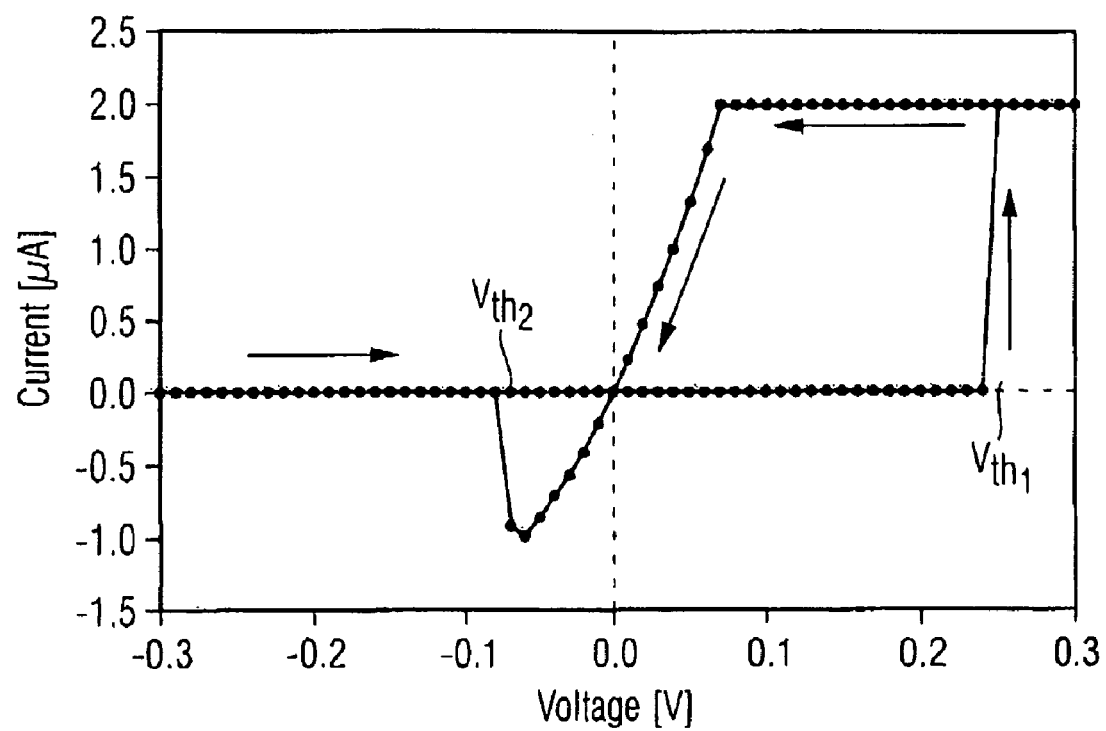
FIG. 2 shows a voltage current characteristic for the resistive memory element shown in FIG. 1.

In FIG. 2 a cell current-voltage-diagram is depicted showing the hysteresis of the resulting current in a resistive memory element when a programming voltage is applied. It is noted that the transitions between the high and the low resistance states are quite short, i.e. the changing of the resistance of the resistive memory element is quite fast when a voltage over the respective programming threshold voltage VTH1 and below an erasing threshold voltage VTH2 are applied.

Figure 3:
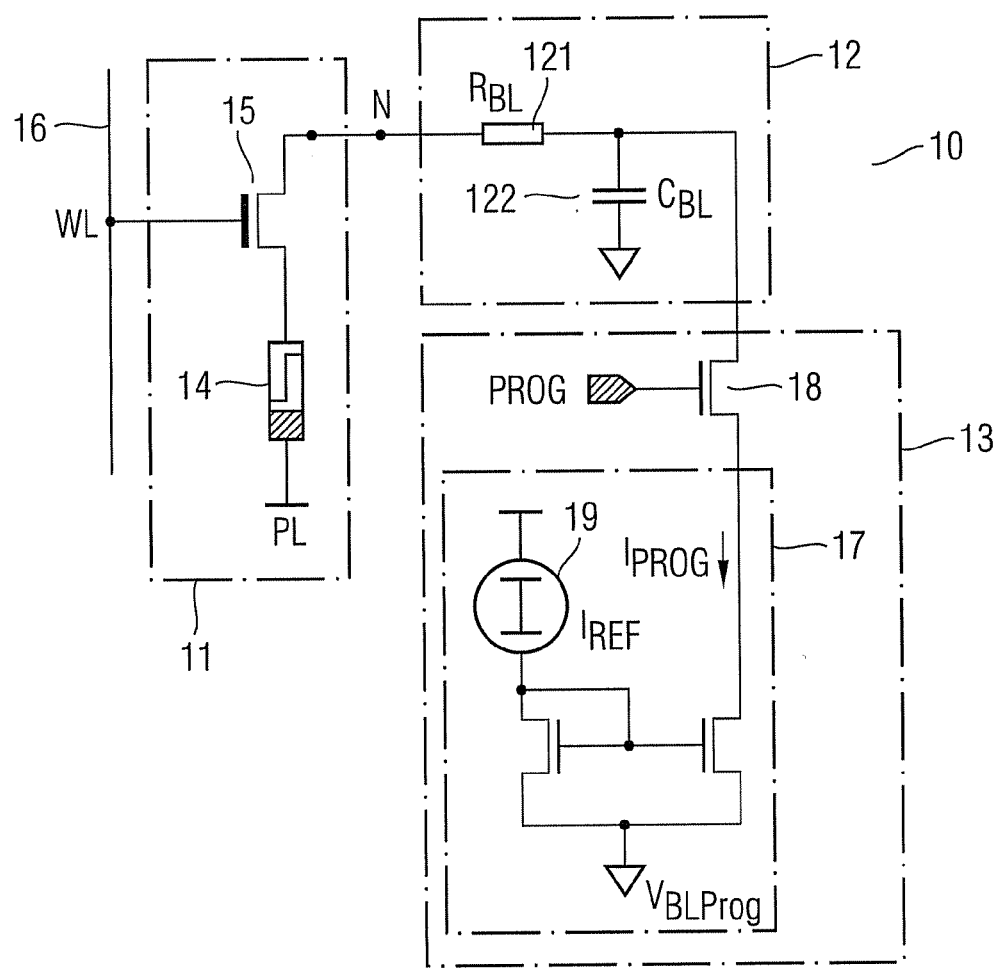
FIG. 3 shows a schematic diagram of a memory circuit used for programming a resistive memory cell comprising a resistive memory element.

In FIG. 3 a schematic of a memory circuit 10 according to the prior art is illustrated. The memory circuit 10 comprises a memory cell 11, a bit line 12 to which the memory cell 11 and other memory cells (not shown) are connected and a programming circuit 13 which is connected to the bit line 12 and which is operable to program the memory cell 11.

The memory cell 11 comprises a resistive memory element 14 and a selection transistor 15 which are coupled serially. In detail, a first terminal of the resistive memory element 14 is coupled to a plate potential PL which is provided by a common plate or by a plate line (not shown). A second terminal of the resistive memory element 14 is coupled to a first terminal of the selection transistor 15. A second terminal of the selection transistor 15 is coupled to the bit line 12. A gate terminal which is operable to control the selection transistor 15 is coupled to a word line 16 on which an activation signal 16 may be applied to open and close the selection transistor 15. The second terminal of the selection transistor 15 is coupled to the bit line 12. The polarity of the resistive memory element 14 is such that a programming to a low resistance state is performed when a positive voltage is applied between the first and the second terminal of the resistive memory element 14 and an erasing to a high resistance state is performed when a negative voltage is applied thereon.

The bit line is coupled to the programming circuit 13 comprising a switchable current source designed as a current mirror circuit 12 for providing a predetermined programming current $I_{PROG}$. The current mirror circuit 17 provides a reference current source 19 for providing a reference current $I_{REF}$ which is mirrored as the programming current $I_{PROG}$ in a current path which is coupled to the bit line 12. The current mirror 17 has a first mirror transistor 26 a first terminal of which is coupled to the reference current source 19 and a second terminal of which is coupled to a programming voltage source which supplies a programming voltage $V_{BLPROG}$. A gate terminal of the first mirror transistor 26 is coupled to its drain terminal. A second mirror transistor 27 has a gate terminal which is coupled with the first terminal of the first mirror transistor 26. A first terminal of the second mirror transistor is coupled to a programming transistor 18 and a second terminal is coupled to a programming potential $V_{BLPROG}$. Between the bit line 12 and the current mirror circuit 17, the programming transistor 18 is arranged which couples or decouples the programming current source 17 to or from the bit line 12 depending on a programming signal indicating that the addressed resistive memory cell should be programmed or not.

While programming a resistive memory cell the programming transistor 18 is closed such that the programming potential $V_{BLPROG}$ is applied onto the bit line. As the resistive memory element 14 in its high resistance state does substantially not allow any current to flow through the resistive memory element 14 its programming potential is applied on the bit line 12 such that the programming voltage is supplied on the resistive memory element 14. The programming voltage results in a programming of the resistive memory element such that its resistance state changes to a low resistance state. In this condition the programming circuit 13 works as a current source and limits the current flowing through the resistive memory element 14 while its resistance decreases. Thus, the programming circuit 13 operates as a programming voltage source coupled to the bit line and switches automatically to the current source operation while the resistance of the resistive memory element 14 exceeds a specific resistance. From thereon the current through the resistive memory element 14 has to be limited by the current source functionality of the programming circuit 13. Herein, the bit line 12 is illustrated as a box indicated with a dotted line. The electrical resistance of the bit line 12 is indicated by the bit line resistor 121 and the capacity of the bit line 12 is indicated by the bit line capacitor 122.

The programming circuit 13 can be coupled to the bit line 12 directly or by means of a column select transistor (not shown). One programming circuit 13 can be used for a number of bit lines each connected with a respective column select transistor to selectively couple the programming circuit to the respective bit line.

If a condition occurs in which the resistive memory element 14 is in a high resistance state and a programming of the resistive memory cell 11 should be carried out, the selection transistor is controlled via the word line 16 in such way that it is closed to couple the second terminal of the resistive memory element 14 to the bit line 12. After closing the selection transistor 15, the programming transistor 18 is closed by applying the corresponding programming signal PROG. Thereby, the programming voltage $V_{BLPROG}$ is applied via the bit line 12 to the resistive memory cell 11. As the resistive memory element 14 is in a high resistance state, the programming voltage is applied on the resistive memory element 14 which exceeds the programming threshold voltage VTH1 as described in conjunction with FIG. 2.

The application of the programming voltage at the resistive memory element 14 results in a rapid change of the resistance of the resistive memory element 14. Due to the rapid change of the resistance of the resistive memory element 14 the current through the resistive memory element 14 quickly increases. The corresponding potential on the bit line 12, particularly on a virtual node N between the resistive memory cell 11 and the bit line 12, also tends to change since the resistive memory element 14, the selection transistor 15 and the bit line resistance $R_{BL}$ form a voltage divider such that the bit line potential e.g. at the node N tends to follow the rapid change of the resistance of the resistive memory element. Due to the bit line capacity the change of the potential on the bit line 12 has to be supported by the programming current provided by the programming circuit 13.

As the current change through the resistive memory element 14 usually is too fast as to be fully supported by the driving capability of the programming circuit 13 during the switching, the recharging of the bit line capacity does not take place immediately but depending on the programming current $I_{PROG}$ provided by the programming circuit 13. The sudden change of the current flowing through the resistive memory element 14 may damage the resistive memory element 14 if applied for a longer time than the specific time period.

Figure 4:
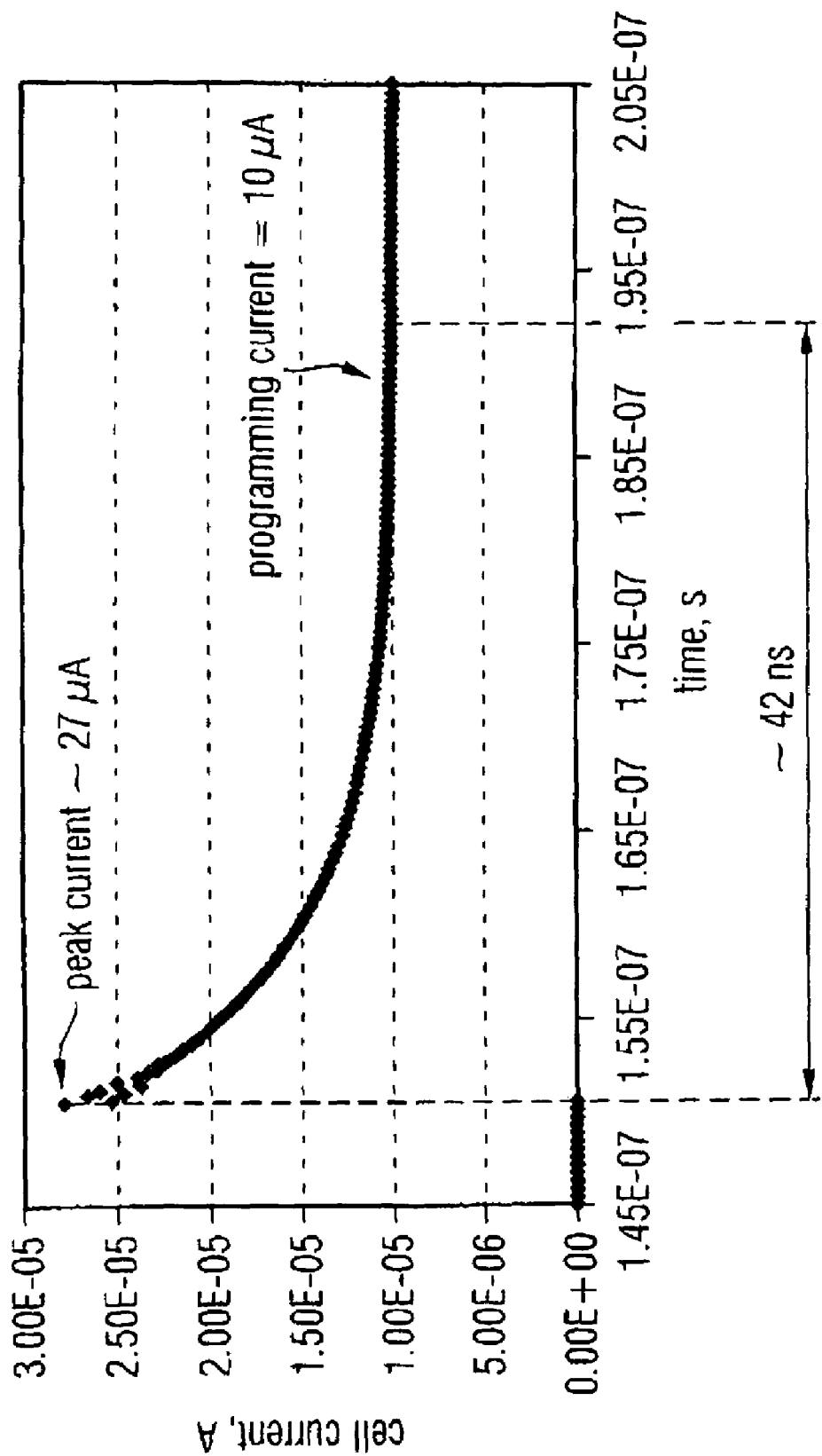
FIG. 4 depicts a cell current time diagram showing the cell current through the resistive memory element during programming.

In FIG. 4, a cell current-time-diagram is depicted wherein the characteristic of the cell current $I_{cell}$ resulting from the change of the resistance of the resistive memory element 14 is exemplarily illustrated. In the shown example, it can be seen that the peak current reaches a current value which is more than two and a half times higher than the programming current applied for programming the resistive memory cell 11. In the given example, the time period during which the higher current is applied is about 42 ns.

To reduce the time during which the high current through the resistive memory element 14 is applied due to a programming of the resistive memory cell 11, a bleeder circuit 20 is coupled to the bit line which is operable to provide a further current (a bleeder current) to support the change of the bitline potential such that the bitline potential is recharged faster than it would be possible solely by the programming current source 17 of the programming circuit 13.

Figure 5:
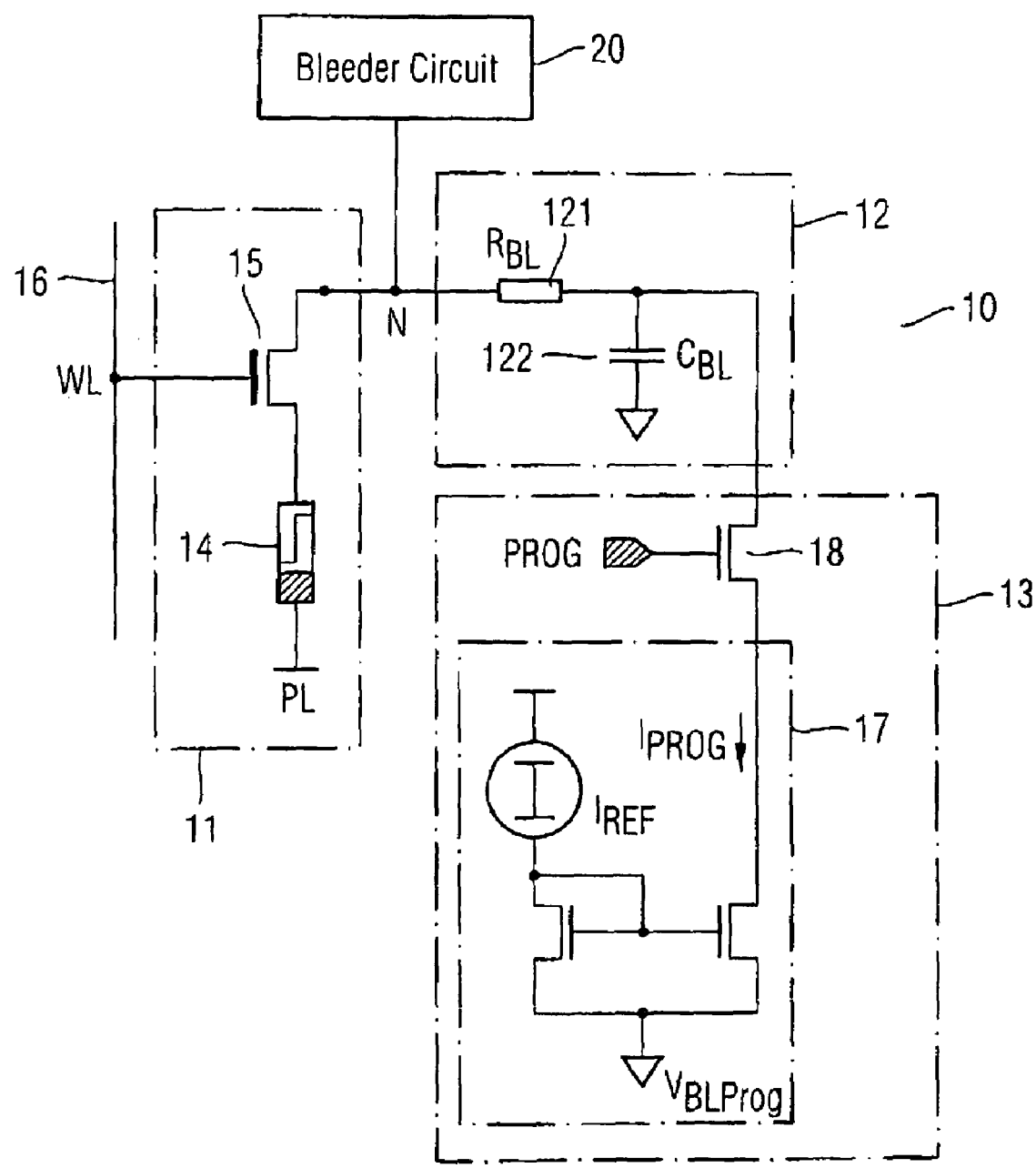
FIG. 5 shows a block diagram of a memory circuit according to a first embodiment of the present invention.

In FIG. 5, a first embodiment of a memory circuit according to the present invention is depicted. In the following embodiments, the same reference signs indicate same elements or elements having a similar function. A bleeder circuit 20 is provided and connectable to the bit line 12 close to the resistive memory cell 11, close to the programming circuit 13 or close to any other position of the bit line. In the given examples the bleeder circuit 20 is located close to the node N which is located along the bit line 12. Furthermore, a data line (not shown) may be provided to which the programming circuit 13 is coupled wherein with the data line the bit lines are connected directly or via respective addressing switches, e.g. in form of column-select-transistors.

To avoid any further influences of the bleeder circuit 20 onto the operation of the memory circuit 10, the bleeder circuit is applied to the bit line 12 merely during the time the cell current through the resistive memory element 14 exceeds the programming current applied by the programming circuit 13.

Figure 6:
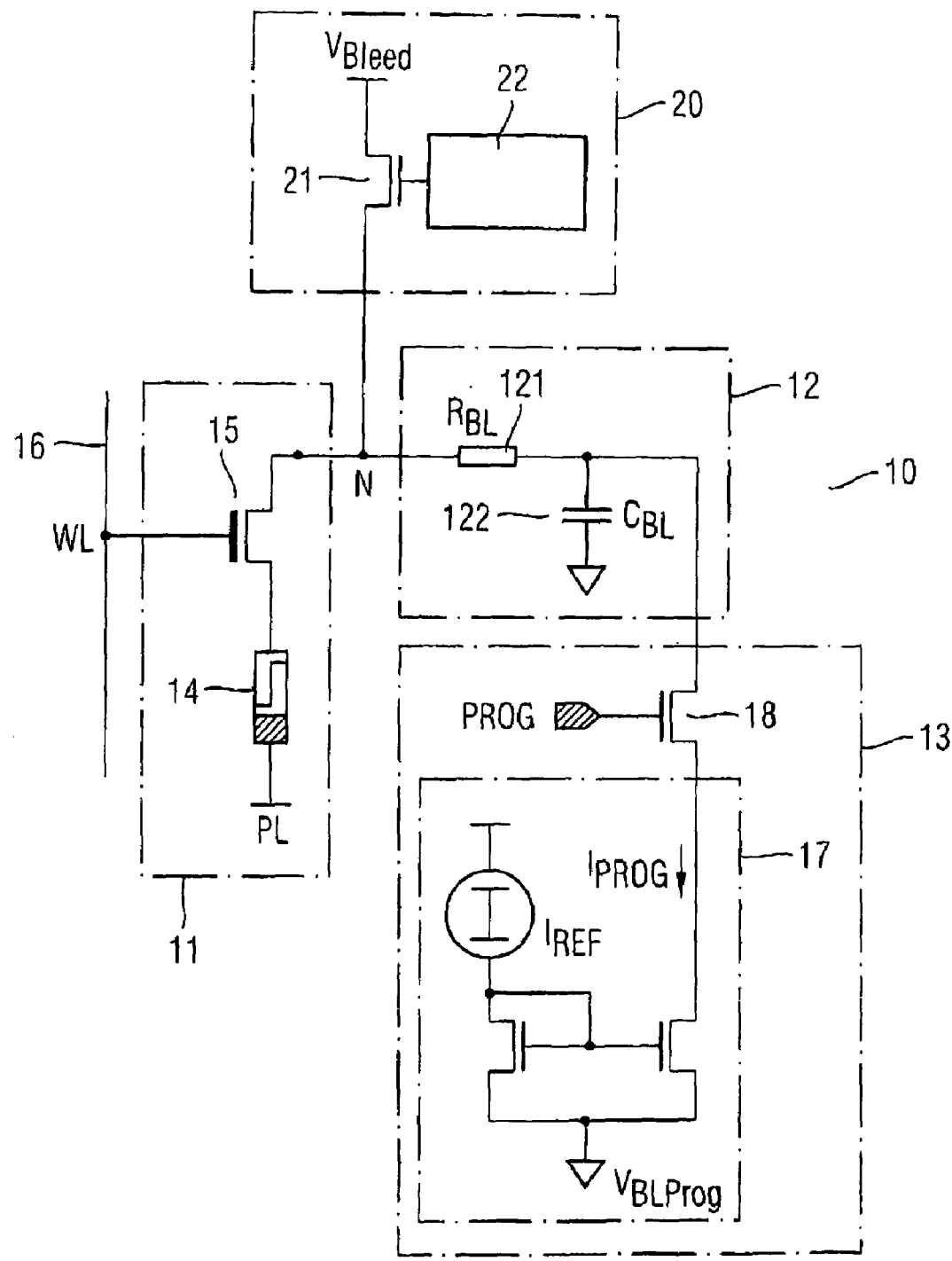
FIG. 6 shows a block diagram of a memory circuit according to a second embodiment of the present invention.

In FIG. 6, a second embodiment of the present invention is shown wherein the bleeder circuit 20 is illustrated in more detail. The bleeder circuit 20 comprises a bleeder transistor 21 which is coupled to a bleeder potential $V_{BLEED}$, preferably the plate potential, by a first terminal and with the bit line 12 by a second terminal. A gate terminal of the bleeder transistor 21 is coupled to a control circuit 22 which controls the bleeder transistor 21 to couple or decouple the bleeder potential $V_{BLEED}$ with the bit line 12. Instead of the plate potential, any other appropriate potential can be used which supports the potential change resulting from the rapid change of the resistance of the resistive memory element 14 on the bit line 12. The control circuit 22 closes the bleeder transistor 21 at the time when the resistance change of the resistive memory element 14 occurs and preferably opens the bleeder transistor 21 when the cell current through the resistive memory element 14 equals or has approached the programming current supplied by the programming circuit 13. The control circuit 22 may provide a predetermined timing of the activation and deactivation of the bleeder transistor 21 or may control the bleeder transistor 21 depending on electrical states within the memory circuit 10.

Figure 7:
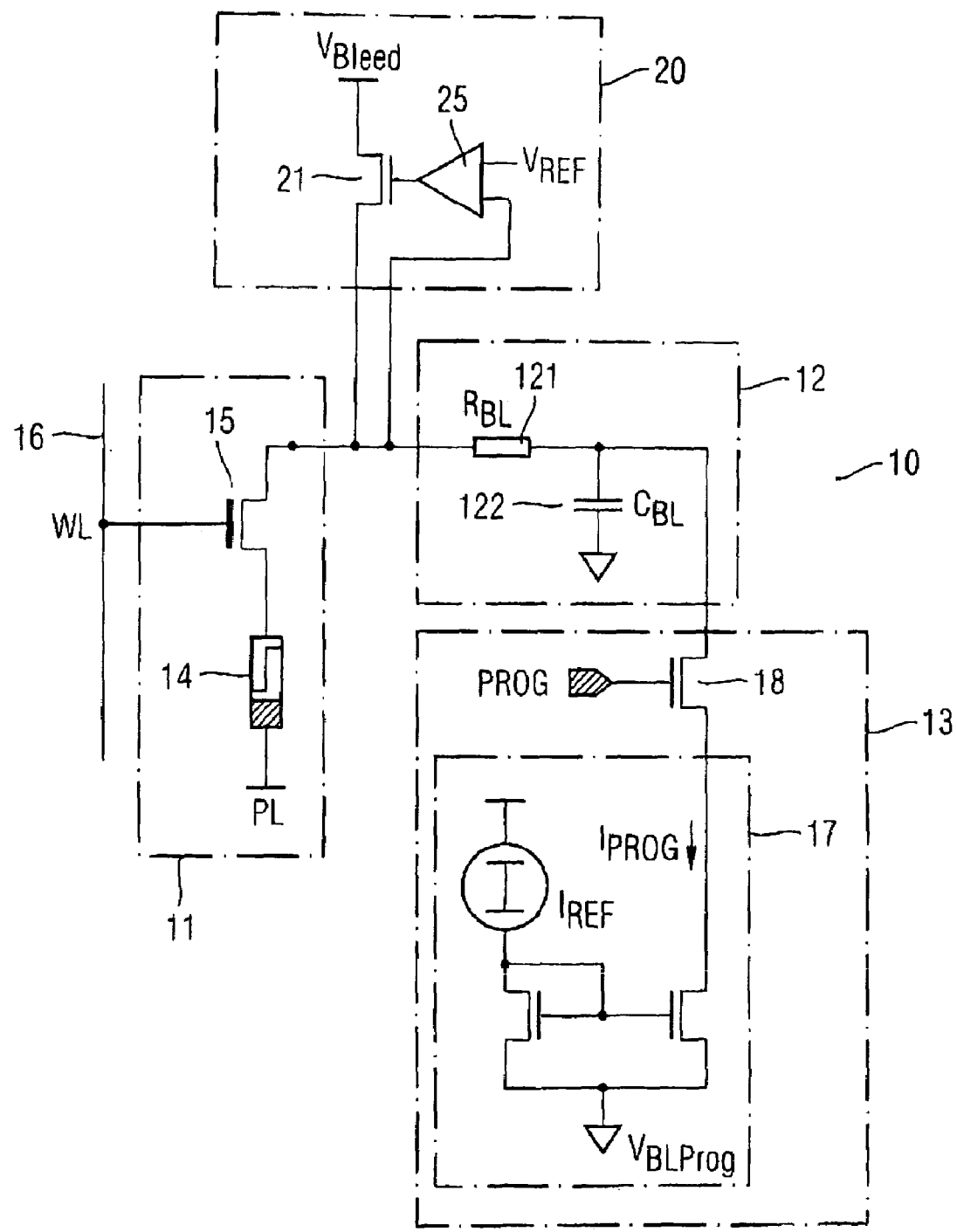
FIG. 7 shows a schematic diagram of a memory circuit according to a third embodiment of the present invention.

In FIG. 7, a third embodiment of the present invention is illustrated. In order to switch the bleeder circuit 20 on to a specific time, a comparator 25 can be used. The comparator receives a reference voltage $V_{REF}$ which is preferably set to the programming voltage at a first input. A second input of the comparator 25 is connected to the bit line 12 to receive the bit line potential. The comparator 25 is operable to detect the appliance of the programming potential wherein the comparator 25 closes the bleeder transistor 21 such that a higher current can be supplied to the bit line 12 as long as the potential of the bit line 12 has not reached the programming potential. The reference voltage $V_{REF}$ can be set such that the bleeder transistor 21 closes when the bit line potential exceeds the programming potential far more than a threshold voltage and remains closed until the bit line potential has approached the programming potential for less than a threshold voltage. Thereby, the time period during which the bleeder potential is applied to the bit line can be increased. To avoid any further influences of the bleeder circuit 20 onto the operation of the memory circuit 10, the bleeder circuit 20 is applied to the bit line 12 merely during the time the cell current through the resistive memory element 14 exceeds the programming current applied by the programming circuit 13. Instead or in addition to the provision of the comparator 25, a slope detector (not shown) can be provided which detects the gradient of the bit line potential and controls the bleeder transistor 21 such that it is closed if a gradient of the change of the bit line potential exceeds a threshold gradient value. In each of the embodiments, the opening of the bleeder transistor 21 can be controlled by the slope detector in such a way that the bleeder transistor 21 is opened after a predetermined time. The predetermined time can be dependent on at least one of the parameters of the programming potential provided by the programming potential and the bit line potential, the capacity of the bit line and the resistance of the bit line.

Figure 8:
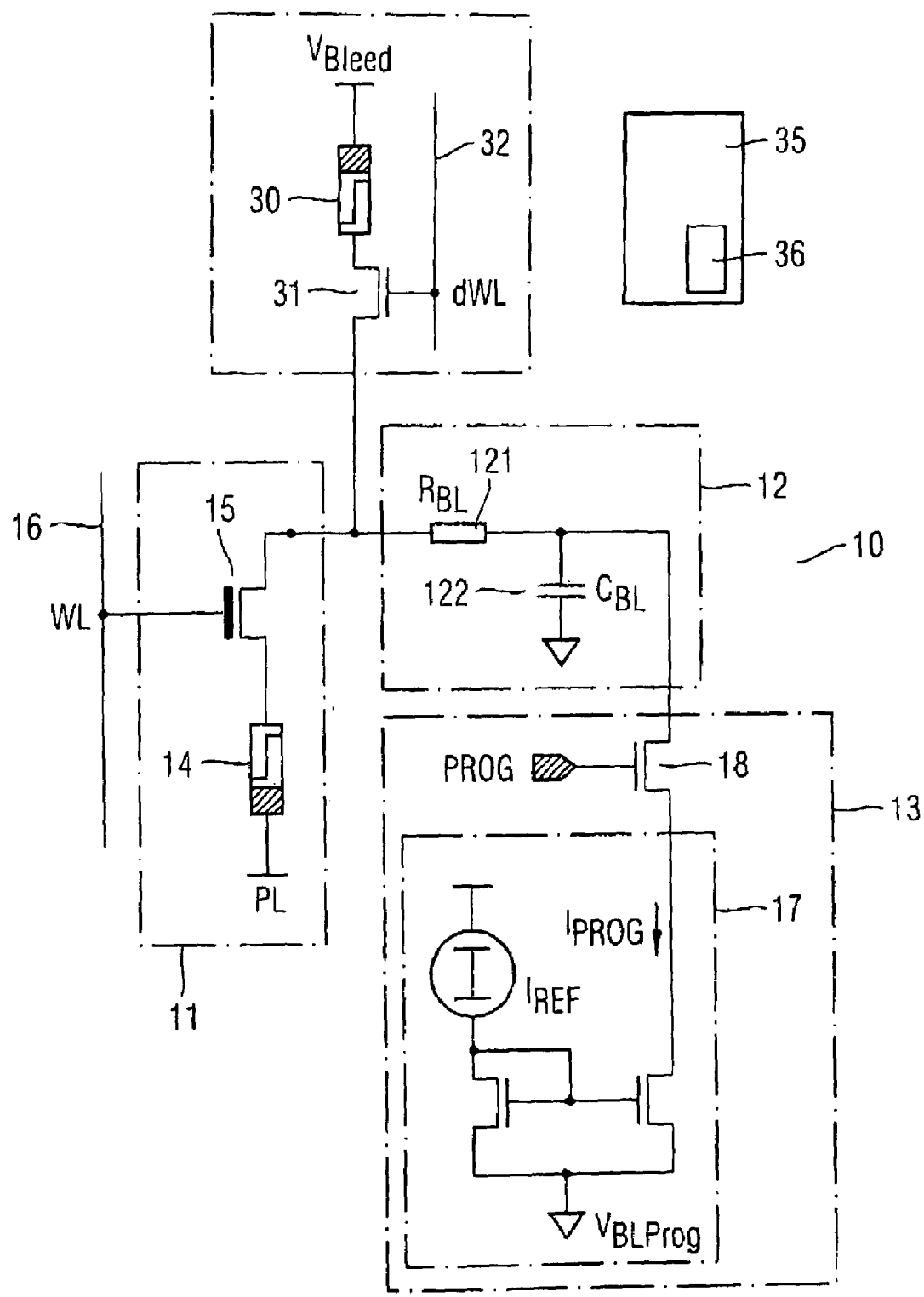
FIG. 8 shows a schematic diagram of a memory circuit according to a fourth embodiment of the present invention.

In FIG. 8, another option to realize a bleeder circuit 20 is shown wherein a dummy resistive memory element is used which is coupled in series with a further bleeder transistor 31. The dummy resistive memory element 30 is coupled with a first terminal with the plate potential PL and with a second terminal with a first terminal of the further bleeder transistor 31. A second terminal of the bleeder transistor 31 is coupled with the bit line 12. A gate terminal of the further bleeder transistor 31 is coupled via a dummy word line 32 with a control circuit 35. While programming the resistive memory cell 11, the activation signal on the word line 16 (provided by a not shown addressing logic) activates the selection transistor 15 to couple the resistive memory element 14 to the bit line 12. Substantially at the same time, the control circuit 35 which is coupled with the addressing logic generates a dummy activation signal DWL on the dummy word line 32 which activates the further bleeder transistor 31 to couple the dummy resistive memory element 30 with the bit line 12. The coupling is carried out in such a way that programming circuit 13 programs the resistive memory element 14 and the dummy resistive memory element 30 simultaneously so that the resistive memory element 14 and the dummy resistive memory element 30 change their resistance states almost at the same time from the high resistance state to the low resistance state. The control circuit 35 further comprises an erasing circuit 36 which is coupled with the dummy resistive memory element 30 to erase the dummy resistive memory element 30 after it has been used for programming a resistive memory element 14, i.e. the dummy resistive memory element 30 is brought to a high resistance state again. Thereby, the overall resistance change of the resistive memory elements 14, 30 is lower such that the potential change on the bit line (i.e. recharging) is lower compared to the embodiments described before. The resulting effect is that the capacity of the bit line is recharged by both the cell current and the current through the dummy resistive memory element 30 of the bleeder circuit 20. This results in a reduced recharging time of the capacity of the bit line consequently to a reduction of the time during which a high current peak through the resistive memory element flows.

To improve the recharging effect due to the utilization of the dummy resistive memory element 30 a plurality of dummy resistive memory elements 30 can be employed which may be coupled to the bit line via the single further bleeder transistor 31.

In FIG. 9, a cell current-time-diagram is depicted showing the effect of the usage of a bleeder circuit according to one of the embodiments as described before. As the recharging of the bit line is supported by an additional current provided by the bleeder circuit, the current peak through the resistive memory element 14 is reduced in time such that the programming current is settled more rapidly. Compared to the cell current-time-diagram of FIG. 4, the period of time during which the high cell current flows through the resistive memory element 14 is reduced to a time of about 26 ns compared to 42 ns in the prior art example.

While the foregoing is directed to embodiments of the present invention, other and further embodiments of the invention may be devised without departing from the basic scope thereof, and the scope thereof is determined by the claims that follow.

What is claimed is:

1. An integrated circuit, comprising:
   a resistive memory element coupled to a plate potential by a first terminal of the resistive memory element;
   a selection transistor having a first terminal coupled to a second terminal of the resistive memory element;
   a bit line coupled to a second terminal of the selection transistor and connectable to the resistive memory element via the selection transistor;
   a programming circuit operable to provide a programming voltage and to change a resistance of the resistive memory element during a programming operation, the programming circuit being connectable to the bit line and to the second terminal of the selection transistor via the bit line, wherein the programming circuit applies a programming signal via the bit line to the resistive memory element to transfer the resistive memory element into a low resistance state, and wherein the programming signal comprises at least one of a programming voltage and a programming current; and
   a regulator circuit coupled to the second terminal of the selection transistor and operable to provide a regulating current to or from the bit line to change a potential of the bit line in response to a change of the resistance of the resistive memory element caused by the programming circuit during the programming operation, wherein the regulator circuit and programming circuit are separately connectable to the bit line, wherein the regulator circuit comprises:
   a switch to selectively couple a regulator potential to the bit line depending on a regulate signal.

2. The integrated circuit of claim 1, wherein the regulator circuit is operable to supply the regulating current during a predetermined time period.

3. The integrated circuit of claim 1, wherein the regulator circuit is configured such that the time period starts when, after applying the programming voltage via the bit line on the resistive memory element, a gradient of the voltage between the bit line potential and the plate potential exceeds a threshold.

4. The integrated circuit of claim 1, wherein the regulator circuit is configured such that the time period starts when, after applying the programming voltage via the bit line on the resistive memory element, a difference between the programming voltage and the bit line potential exceeds a threshold.

5. The integrated circuit of claim 1, wherein the regulator circuit is configured such that the time period ends after a predetermined time.

6. The integrated circuit of claim 5, wherein the predetermined time is determined based on at least one parameter selected from:
   the programming voltage applied on the resistive memory element during the programming;
   a resistance change gradient due to the appliance of the programming current;
   a difference between the programming voltage and the bit line potential;
   a capacity of the bit line; and
   a resistance of the bit line.

7. The integrated circuit of claim 1, wherein the regulator circuit comprises:
   a comparator which is operable to detect a voltage change between the bit line and a reference potential which depends on the programming voltage, due to the change of the resistance of the resistive memory element and to generate the regulate signal depending on the voltage change.

8. The integrated circuit of claim 7, wherein the regulator circuit further comprises another switch arranged in series to the switch and which is closed during a predetermined time period.

9. The integrated circuit of claim 1, wherein the selection transistor is arranged to selectively couple the resistive memory element to the bit line depending on an activation signal.

10. A memory circuit, comprising:
   a resistive memory element coupled to a plate potential by a first terminal of the resistive memory element;
   a bit line connectable to a second terminal of the resistive memory element;
   a programming circuit operable to provide a programming voltage to change a resistance of the resistive memory element during a programming operation, the programming circuit being connectable to the bit line; and
   a bleeder circuit connectable to the bit line and operable to provide a bleeding current to or from the bit line during the programming operation to change a potential on the bit line in response to a change of the resistance of the resistive memory element caused by the programming circuit during the programming operation;
   wherein the bleeder circuit comprises a dummy resistive memory element which is coupled to a bleeder potential with a first terminal of the dummy restrictive memory element and which is connectable to the bit line by a second terminal of the dummy restrictive memory element.

11. The memory circuit of claim 10, wherein the dummy resistive memory element is configured similarly to the resistive memory element.

12. The memory circuit of claim 10, wherein the programming circuit applies a programming signal via the bit line to the resistive memory element to transfer the resistive memory element into a low resistance state.

13. The memory circuit of claim 12, wherein the programming signal comprises at least one of a programming voltage and a programming circuit.

14. The memory circuit of claim 13, wherein the bleeder circuit further comprises a bleed transistor to selectively couple the dummy resistive memory element to the bit line.

15. The memory circuit of claim 13, wherein a selection transistor is arranged to selectively couple the resistive memory element to the bit line depending on an activation signal.

16. The memory circuit of claim 15, wherein the bleeder circuit comprises a control circuit which is operable to activate the bleed transistor simultaneously with the activation of the selection transistor such that the dummy resistive memory element is coupled with the bit line when the programming voltage is applied on the resistive memory element by the programming circuit.

17. The memory circuit of claim 16, wherein the control circuit comprises an erasing circuit which is operable to erase the dummy resistive memory element to a high resistance state after the resistive memory element have been programmed.

* * * * *